United States Patent
Bock et al.

(10) Patent No.: US 6,766,791 B2
(45) Date of Patent: Jul. 27, 2004

(54) ACTUATOR REGULATION DEVICE AND CORRESPONDING METHOD

(75) Inventors: Wolfgang Bock, Regensburg (DE); Dirk Baranowski, Regensburg (DE); Christian Hoffmann, Regensburg (DE); Richard Pirkl, Regensburg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/463,090

(22) Filed: Jun. 17, 2003

(65) Prior Publication Data

US 2003/0218437 A1 Nov. 27, 2003

Related U.S. Application Data

(63) Continuation of application No. PCT/DE01/04742, filed on Dec. 17, 2001.

(51) Int. Cl.$^7$ .............................................. F02M 37/04
(52) U.S. Cl. ........................................ 123/498; 123/494
(58) Field of Search .............................. 123/498, 494, 123/478; 239/102.2, 585.1

(56) References Cited

U.S. PATENT DOCUMENTS

| | | | | |
|---|---|---|---|---|
| 4,749,897 A | * | 6/1988 | Natsume et al. | 310/317 |
| 6,499,471 B2 | * | 12/2002 | Shen et al. | 123/498 |

FOREIGN PATENT DOCUMENTS

| | | | | |
|---|---|---|---|---|
| DE | 196 52 801 C1 | 4/1998 | ............ | H02N/2/00 |
| DE | 196 52 809 C1 | 6/1998 | ............ | H02N/2/00 |
| DE | 197 23 932 C1 | 12/1998 | ............ | H02N/2/06 |
| DE | 198 05 184 A1 | 8/1999 | ............ | G01K/7/34 |
| DE | 198 48 950 A1 | 4/2000 | ............ | F02D/41/20 |
| GB | 2334164 A | * 11/1999 | | |
| JP | 64-069756 | 3/1989 | ............ | F02D/41/20 |
| JP | 05344755 A | 12/1993 | ............ | H02N/2/00 |
| WO | WO00/19549 | 4/2000 | ............ | H01L/41/04 |

* cited by examiner

*Primary Examiner*—Mahmoud Gimie
(74) *Attorney, Agent, or Firm*—Baker Botts L.L.P.

(57) ABSTRACT

A method for setting a predetermined travel of an actuator (1), in particular a piezo-electric actuator (1) for an injector of an injection system is disclosed. According to said method, a first electric state variable (Q) of the actuator (1), which determines the travel of the actuator (1), is set. Said first electric state variable (Q) is set in accordance with the temperature ($T_{AKTOR}$) of the actuator (1), to avoid temperature-induced fluctuations of the actuator travel.

22 Claims, 5 Drawing Sheets

ACTUATOR REGULATION DEVICE AND CORRESPONDING METHOD

CROSS-REFERENCE TO RELATED APPLICATION

This application is a continuation of co-pending International Application No. PCT/DE01/04742 filed Dec. 17, 2001, which designates the United States, and claims priority to German application number DE 10063080.4 filed Dec. 18, 2000.

TECHNICAL FIELD OF THE INVENTION

The invention relates to a method for setting a predetermined travel of an actuator, in particular a piezo-electric actuator for an injector of an injection system, and an actuator regulation device for the implementation of such a method.

BACKGROUND OF THE INVENTION

In injection systems in internal combustion engines fuel is injected into the combustion chambers of the internal combustion engine by means of injectors, with the injection process being regulated by piezo-electric actuators, which either release or close a nozzle opening on the basis of their electric regulation. For correct operation of the injector the piezo-electric actuator must therefore achieve constant travel. For the purposes of setting the predetermined actuator travel in various patent applications, such as for example DE 197 23 932, DE 196 52 809 and DE 196 52 801, the physical knowledge is exploited that actuator travel essentially behaves in proportion to the electrical energy supplied. During regulation of the actuator therefore the electrical charge supplied and the resulting electrical voltage are measured, so that they can be used to calculate the electrical energy supplied.

One disadvantage of the known actuator regulation device described above is the fact that the functional relationship between the electrical energy supplied to the actuator and the resulting actuator travel is temperature-dependent, which when used in a car results in discrepancies between the actuator travel and the predetermined target value due to the large temperature fluctuations occurring during operation.

SUMMARY OF THE INVENTION

The object of the invention is therefore to improve the known actuator regulation described above so that the actuator travel can be set irrespective of temperature.

The object can be achieved, by a method for setting a predetermined travel of an actuator, in particular a piezo-electric actuator for an injector of an injection system, in which a first electric state variable of the actuator is set, which determines the travel of the actuator, wherein the first electric state variable is set in accordance with the temperature of the actuator to avoid temperature-induced fluctuations of the actuator travel.

The temperature of the actuator is measured and the first electric state variable can be set in accordance with the measured value for temperature of the actuator. The temperature of the cooling water, the engine oil, and/or the fuel is measured and the temperature of the actuator can be derived from one or more of these measured temperature values. A second electric state variable of the actuator is measured and a target value can be determined from the measured value of the temperature of the actuator for the second electric state variable of the actuator, with the measured value of the second electric state variable being compared with the target value of the second electric state variable, to verify the correctness of the temperature measurement or the electric state variables. A second electric state variable of the actuator is measured and a reference variable can be calculated from the first electric state variable and the second electric state variable, which corresponds to a predetermined travel of the actuator irrespective of the temperature of the actuator, with the first electric state variable being regulated in accordance with the reference variable. The first electric state variable can be the electrical charge of the actuator. The second electric state variable of the actuator can be the electrical voltage of the actuator.

The object can also be achieved by a method for setting a predetermined travel of an actuator comprising the steps of:

setting a first electric state variable of the actuator, which determines the travel of the actuator, in accordance with the temperature of the actuator to avoid temperature-induced fluctuations of the actuator travel, measuring a second electric state variable of the actuator, calculating a reference variable from the first electric state variable and the second electric state variable, which corresponds to a predetermined travel of the actuator irrespective of the temperature of the actuator, regulating the first electric state variable in accordance with the reference variable, wherein the reference variable is calculated on the basis of a known temperature-dependent characteristic curve for the first electric state variable and a known temperature-dependent characteristic curve for the second electric state variable, so that both the first electric state variable and the second electric state variable behave according to the predetermined characteristic curves.

The first electric state variable can be the electrical charge of the actuator. The second electric state variable of the actuator can be the electrical voltage of the actuator. The actuator can be a piezo-electric actuator for an injector of an injection system.

The object can furthermore ba achieved by an actuator regulation device, in particular for regulating a piezo-electric actuator of an injection system for an internal combustion engine, comprising a drive circuit for setting a first electric state variable of the actuator, with the first electric state variable determining the travel of the actuator, and a control or regulation unit for setting the first electric state variable in accordance with the temperature of the actuator.

At least one temperature sensor can be provided to determine the temperature of the actuator, with a first characteristic curve member being positioned between the control or regulation unit and the temperature sensor to determine a target value for the first electric state variable in accordance with the temperature of the actuator. A number of temperature sensors can be provided to determine the oil temperature, the cooling water temperature and/or the fuel temperature, with the temperature sensors being connected on the output side to an analysis unit, which determines the temperature of the actuator from the oil temperature, the cooling water temperature and/or the fuel temperature. An electrical measuring device can be provided to measure a second electric state variable of the actuator and the temperature sensor can be connected to a second characteristic curve member, which determines a target value for the second electric state variable from the measured value of actuator temperature, with the second characteristic curve member and the electrical measuring device being connected to a comparison unit, which compares the target value of the second electric state variable with the measured value of the second electric state variable, in order to verify the correctness of the temperature measurement. An electrical measuring device can be provided to measure a second electric state variable of the actuator and this is connected on the output side to a computing unit, which calculates a reference variable for a regulation unit from the first electric state variable and the second electric state variable, with the regulation unit regulating the first electric state variable in accordance with the reference variable. The first electric state variable can be the electrical charge of the actuator. The second electric state variable of the actuator can be the electrical voltage of the actuator.

The object can also be achieved by an actuator regulation device comprising a drive circuit for setting a first electric state variable of the actuator, wherein the first electric state variable determines the travel of the actuator, a control or regulation unit for setting the first electric state variable in accordance with the temperature of the actuator, an electrical measuring device being provided to measure a second electric state variable of the actuator, and a computing unit connected to the electrical measuring device on the output side, which calculates a reference variable for a regulation unit from the first electric state variable and the second electric state variable, wherein the regulation unit regulates the first electric state variable in accordance with the reference variable, and wherein the computing unit calculates the reference variable on the basis of a known temperature-dependent characteristic curve for the first electric state variable and a known temperature-dependent characteristic curve for the second status variable, so that both the first electric state variable and the second electric state variable behave according to the predetermined characteristic curves.

The first electric state variable can be the electrical charge of the actuator. The second electric state variable of the actuator can be the electrical voltage of the actuator. The actuator can be a piezo-electric actuator of an injection system for an internal combustion engine.

The invention embraces the general technical doctrine of taking actuator temperature into account during electrical regulation of the actuator, in order to avoid temperature-induced fluctuations of the actuator travel.

In a variant of the invention the actuator temperature is measured for this purpose so that it can be taken into account for electrical regulation of the actuator. The actuator temperature is preferably not measured directly here but indirectly, with temperature sensors detecting the oil temperature, the fuel temperature and/or the water temperature, to derive the actuator temperature from these. However other state variables can be detected in addition to the state variables mentioned above, to determine the actuator temperature. The actuator temperature is preferably calculated from a combination of measurement variables, in order to compensate for measurement errors. Actuator temperature is preferably determined in the stationary engine state so that all temperature sensors supply approximately the same measured value.

Instead of the indirect measurement of actuator temperature described above, the actuator temperature can however also be measured directly, for example by positioning a temperature sensor on the actuator. Instead of this the actuator temperature can also be determined by measuring the temperature-dependent capacity of the actuator, by then comparing the measured value of the capacity with the known and previously measured temperature-dependent characteristic curve for capacity of the actuator.

With temperature-dependent electrical control of the actuator a known temperature-dependent characteristic curve is preferably taken as the basis and this shows the electrical charge to be supplied to the actuator to achieve constant travel. The necessary electrical charge is then determined according to this characteristic curve from the measured actuator temperature and the actuator is regulated accordingly. In this manner it is advantageously ensured that actuator travel is constant irrespective of actuator temperature.

In an advantageous embodiment of this variant of the invention the electrical voltage of the actuator is also measured to verify the correctness of the temperature measurement. In addition to the measured value of the electrical voltage of the actuator, a theoretical value is also calculated for the electrical voltage of the actuator, which results from the measured actuator temperature on the basis of a predetermined actuator-specific, temperature-dependent characteristic curve for voltage. In the case of a correct temperature measurement the measured value for actuator voltage must be essentially equal to the theoretically calculated voltage value, resulting from actuator temperature and the characteristic curve for voltage for the actuator. In the event of a discrepancy between the measured voltage value and the theoretically calculated voltage value, there is assumed to be an error. With this embodiment therefore actuator temperature is first measured or derived from one or more measured values. In the case of the measured actuator temperature, the electrical variables charge and voltage of the actuator are determined, in order then to track the actuator charge used as the regulation variable, so that actuator travel is constant. Charge and voltage of the actuator are then also measured, in order to determine the actuator temperature from these and to compare it with the measured value for actuator temperature.

In a different variant of the invention the temperature of the actuator is taken into account for its electrical regulation without requiring a temperature sensor. Two known and previously measured actuator-specific characteristic curves are used as a basis for this. One characteristic curve—as already stated above—shows the electrical charge to be applied to the actuator to achieve a predetermined travel as a function of temperature. The other characteristic curve on the other hand shows the electrical voltage of the actuator required to achieve a predetermined travel as a function of temperature. To achieve a predetermined travel, both voltage and charge should therefore behave according to the predetermined characteristic curves, so that a temperature-independent reference variable can be calculated from voltage and charge and used to regulate the electrical charge to be applied to the actuator. The actuator charge is preferably regulated in such a way that the temperature-independent reference variable assumes a constant value. This variant of the invention has the particular advantage that a separate temperature sensor is not required.

BRIEF DESCRIPTION OF THE DRAWINGS

Other advantageous developments of the invention are described in more detail below with respect to the preferred embodiments of the invention using the Figures. These show.

DETAILED DESCRIPTION OF THE PREFERRED EMBODIMENTS

Figure 1A:
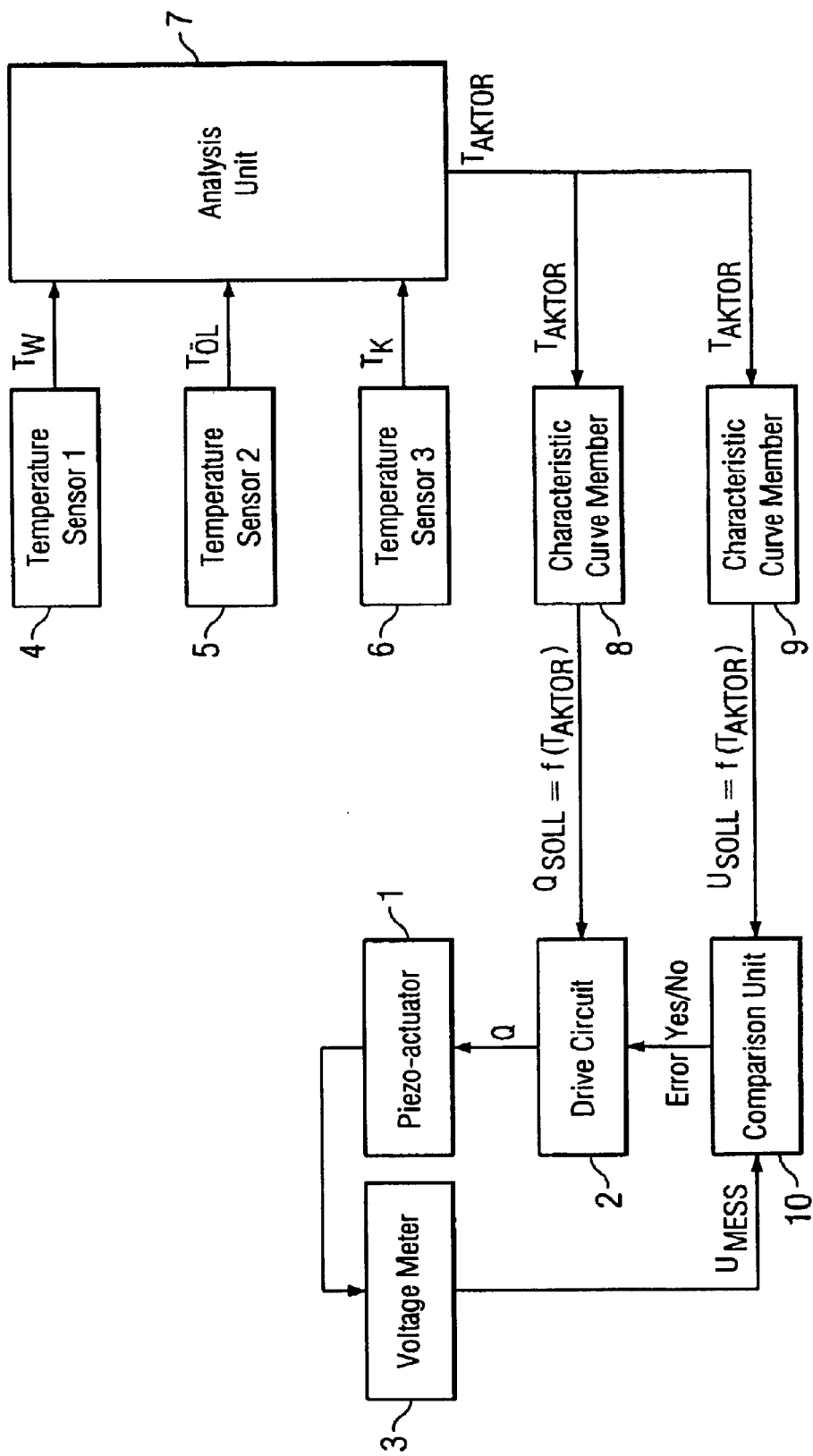
FIG. 1a An actuator regulation device according to the invention with a separate temperature sensor, FIG. 1b The method of operation of the actuator regulation as shown in FIG. 1a in the form of a flow diagram, FIG. 2a An actuator regulation device according to the invention without a separate temperature sensor, FIG. 2b The method of operation of the actuator regulation as shown in FIG. 2a in the form of a flow diagram, FIG. 3 Two actuator-specific characteristic curves.

The actuator regulation device shown in FIG. 1a in a block circuit diagram is used to regulate a piezo-electric actuator 1, used in an injector in an injection system for an internal combustion engine. The purpose of regulating the actuator 1 is to set a predetermined constant travel, as will be explained in detail.

The actuator 1 is regulated electrically by means of a drive circuit 2, which supplies a predetermined electrical charge Q to the actuator 1. An electrical voltage U is then set at the actuator 1 on the basis of the electrical charge Q of the actuator 1 and said voltage is measured by a voltage meter 3. The physical knowledge is exploited here that the travel of the actuator 1 is essentially determined by the electrical energy applied to the actuator 1, with the electrical energy resulting from the product of charge Q and voltage U.

The functional relationship between the electrical energy applied to the actuator 1 and the travel of the actuator 1 is however also temperature-dependent, so that temperature is taken into account during regulation of the actuator 1, in order to avoid temperature-induced fluctuations of the actuator travel. For this purpose the actuator regulation device has three temperature sensors 4, 5, 6, which measure the cooling water temperature $T_W$, the oil temperature $T_{\ddot{O}L}$ or the fuel temperature $T_K$ and forward them to an analysis unit 7, which derives the actuator temperature $T_{AKTOR}$ from them. On the output side the analysis unit 7 is connected to two characteristic curve members 8, 9, which determine the electrical charge $Q_{SOLL}$ or electrical voltage $U_{SOLL}$ required to achieve the predetermined travel from the actuator temperature $T_{AKTOR}$. The functional relationship shown in FIG. 3 between the actuator temperature $T_{AKTOR}$ and the required charge Q or required voltage U are utilized here. The characteristic curve member 8 therefore defines the target value $Q_{SOLL}$ for the electrical charge to be applied to the actuator 1 for the drive circuit 2 on the basis of actuator temperature $T_{AKTOR}$ so that a constant travel is set irrespective of the actuator temperature $T_{AKTOR}$.

The actuator regulation device also verifies the correctness of the temperature measurement, with a comparison unit 10 comparing the measured voltage value $U_{MESS}$ with the target value for voltage $U_{SOLL}$ determined by the characteristic curve member 9 by. If the temperature is determined correctly by the temperature sensors 4–6, the analysis unit 7 and the characteristic curve member 9, the measured value $U_{MESS}$ must be essentially equal to the theoretically calculated value $U_{SOLL}$. The comparison unit 10 forwards the result of the verification as an error signal to the drive circuit 2.

Figure 1B:
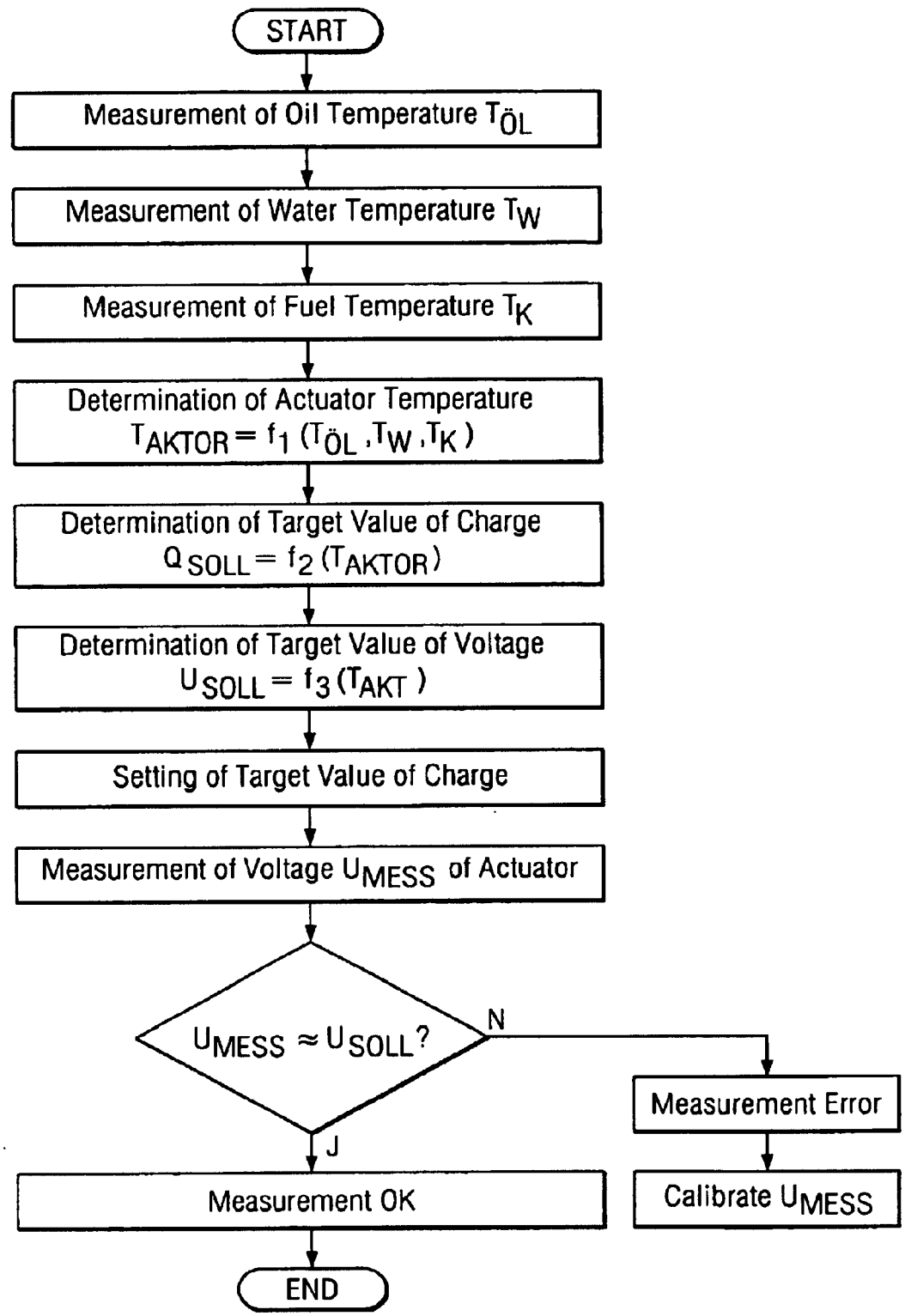

The method of operation of the actuator regulation device as shown in FIG. 1a is now described briefly below with reference to the flow diagram shown in FIG. 1b.

First the oil temperature $T_{\ddot{O}L}$, the water temperature $T_W$ and the fuel temperature $T_K$ are measured in order to determine the actuator temperature $T_{AKTOR}=f_1(T_{\ddot{O}L}, T_W, T_K)$ from them in a subsequent stage. The characteristic curve member 8 then assigns a target value for the electrical charge $Q_{SOLL}$ to be applied to the actuator 1 to the measured actuator temperature $T_{AKT}$.

The characteristic curve member 9 also determines the theoretically calculated target value for the electrical voltage $U_{SOLL}$ of the actuator 1, which must result when the electrical charge $Q_{SOLL}$ determined beforehand as the target value has been applied to the actuator 1, in accordance with the measured actuator temperature $T_{AKT}$.

The drive circuit 2 then regulates the actuator 1 so that the charge of the actuator 1 is equal to the predetermined target value.

The voltage $U_{MESS}$ of the actuator 1 is then measured and compared with the theoretically calculated value $U_{SOLL}$, with a measurement error being assumed in the event of a discrepancy between $U_{MESS}$ and $U_{SOLL}$, allowing calibration of the measured voltage $U_{MESS}$.

Figure 2A:
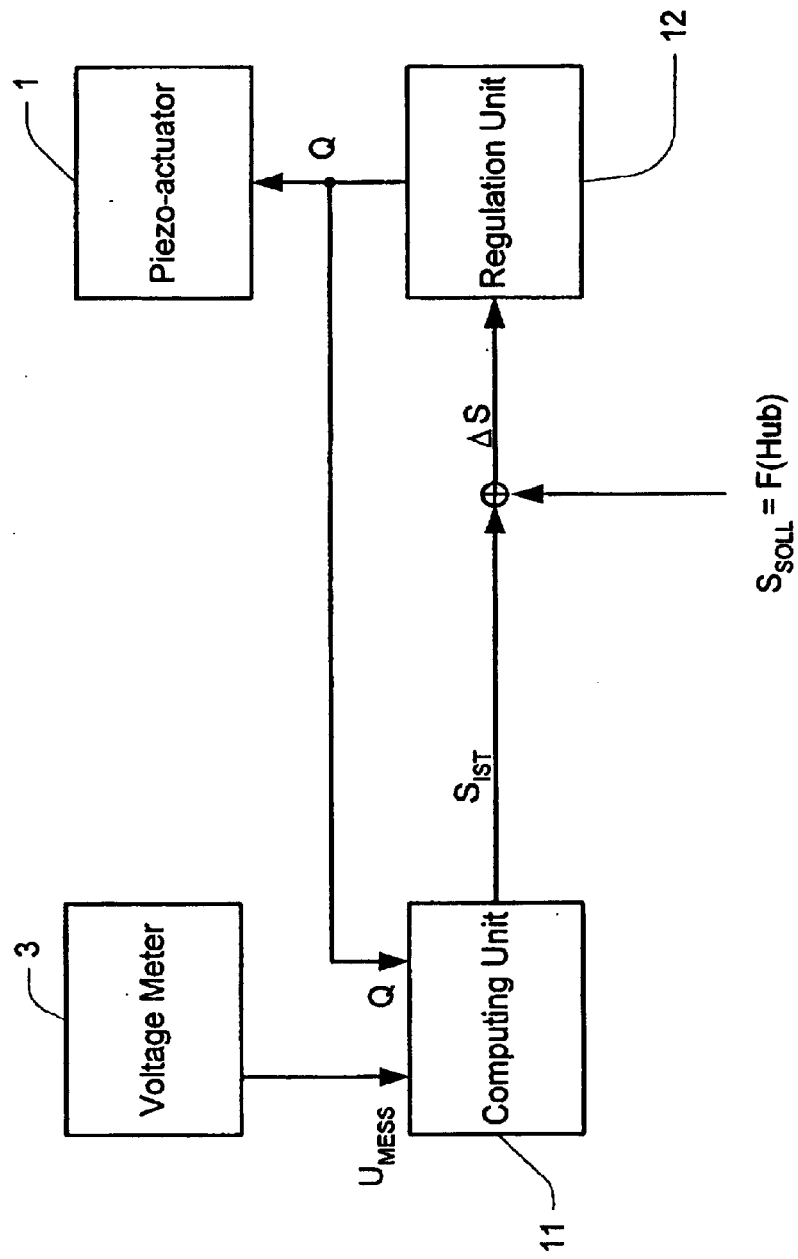
Figure 3:
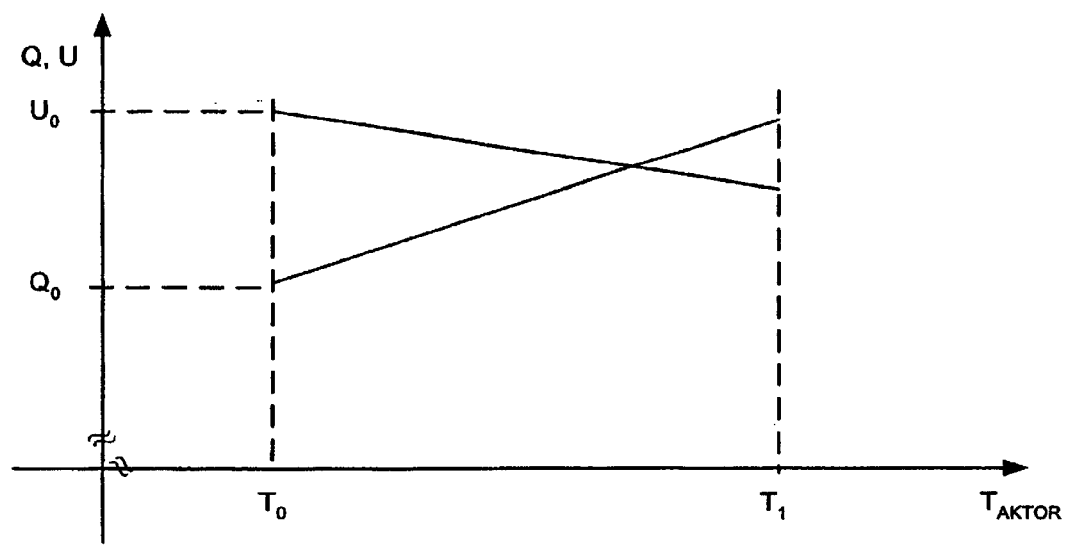

The alternative embodiment of the actuator regulation device according to the invention as shown in FIG. 2a advantageously allows actuator temperature to be taken into account during regulation of the actuator 1 without requiring a separate temperature sensor. The known characteristic curves of the actuator 1 shown in FIG. 3 are also used here, showing the functional relationship between the charge Q or voltage U of the actuator 1 required to achieve a predetermined travel and the actuator temperature $T_{AKTOR}$. The electrical charge Q of the actuator 1 and the electrical voltage $U_{MESS}$ of the actuator 1 measured by the voltage meter 3 are therefore fed to a computing unit 11, which calculates a temperature-independent reference variable s from the charge Q and the voltage $U_{MESS}$ of the actuator 1 and feeds it to a regulation unit 12, which regulates the electrical charge Q of the actuator 1 in accordance with the reference variable s, with the reference variable s determining the required travel.

Generally the temperature-dependent characteristic curves shown in FIG. 3 are approximately linear, so that the following applies:

$$U_{SOLL}=U_0+b.(T-T_0)$$

$$Q_{SOLL}=Q_0+a.(T-T_0)$$

These two formulae for the charge Q and the voltage U then give a temperature-independent reference variable s as follows:

$$Q = Q_0 + a \cdot \frac{U - U_0}{b}$$

$$\Rightarrow Q - \frac{a}{b} \cdot U = Q_0 + \frac{a}{b} \cdot U_0$$

$$\Rightarrow s = Q - \frac{a}{b} \cdot U = Q_0 + \frac{a}{b} \cdot U_0 = const.$$

Actuator travel is therefore constant, when the reference variable s is regulated to a constant value, with the value of the reference variable s determining the travel of the actuator 1.

Figure 2B:
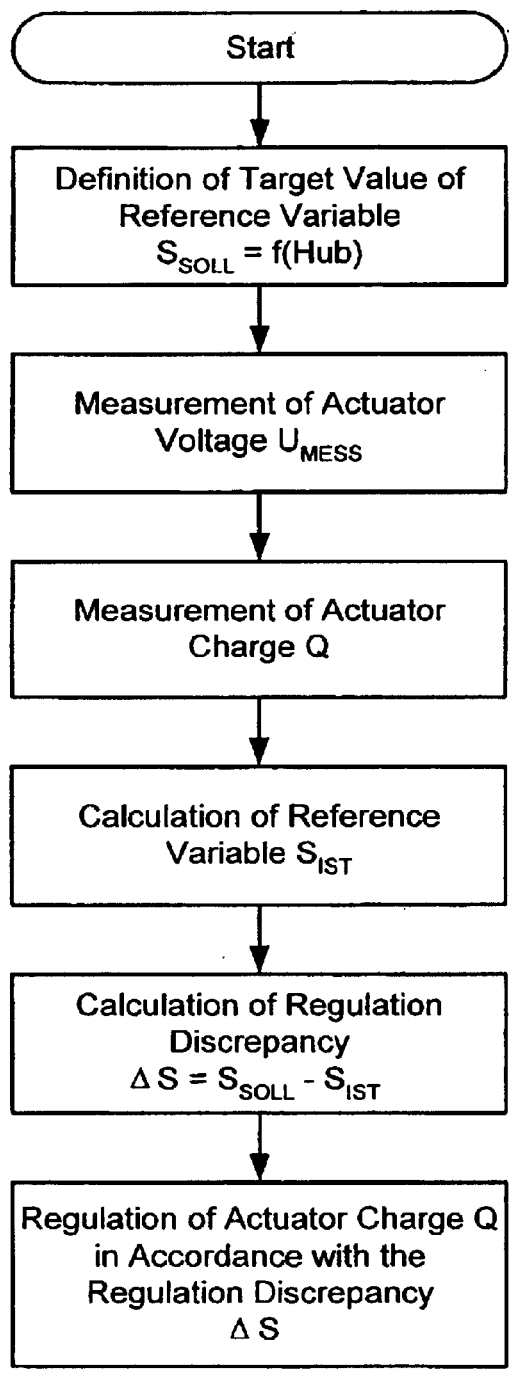

The method of operation of actuator regulation as shown in FIG. 2a is described below with reference to the flow diagram shown in FIG. 2b.

At the start the target value $s_{SOLL}$ of the reference variable s is first defined and this determines the travel.

The actuator voltage $U_{MESS}$ and the actuator charge U are then measured in a control loop and the current value of the reference variable s is determined from these. The regulation discrepancy is then determined as the difference between the target value $s_{SOLL}$ of the reference variable and the calculated value of the reference variable. The actuator charge Q is then regulated continuously or in stages in accordance with the regulation discrepancy $\Delta s$.

The invention is not restricted to the examples of embodiments described above. Rather a large number of variants and modifications are conceivable, which also utilize the inventive idea and which are therefore covered by the scope of the patent.

What is claimed is:

1. Method for setting a predetermined travel of an actuator, in particular a piezo-electric actuator for an injector of an injection system, in which a first electric state variable of the actuator is set which determines the travel of the actuator, wherein the first electric state variable is set in accordance with the temperature of the actuator to avoid temperature-induced fluctuations of the actuator travel and wherein a second electric state variable of the actuator is measured and a reference variable is calculated from the first electric state variable and the second electric state variable, which corresponds to a predetermined travel of the actuator irrespective of the temperature of the actuator, with the first electric state variable being regulated in accordance with the reference variable.

2. Method according to claim 1, wherein the temperature of the actuator is measured and the first electric state variable is set in accordance with the measured value for temperature of the actuator.

3. Method according to claim 1, wherein the temperature of the cooling water, the engine oil, and/or the fuel is measured and the temperature of the actuator is derived from one or more of these measured temperature values.

4. Method according to claim 1, wherein a second electric state variable of the actuator is measured and a target value is determined from the measured value of the temperature of the actuator for the second electric state variable of the actuator, with the measured value of the second electric state variable being compared with the target value of the second electric state variable, to verify the correctness of the temperature measurement or the electric state variables.

5. Method according to claim 1, wherein the first electric state variable is the electrical charge of the actuator.

6. Method according to claim 1, wherein the second electric state variable of the actuator is the electrical voltage of the actuator.

7. An actuator regulation device, in particular for regulating a piezo-electric actuator of an injection system for an internal combustion engine, comprising:
   a drive circuit for setting a first electric state variable of the actuator, with the first electric state variable determining the travel of the actuator;
   a control or regulation unit for setting the first electric state variable in accordance with the temperature of the actuator; and
   an electrical measuring device operable to measure a second electric state variable of the actuator and connected on an output side to a computing unit, the computing unit operable to calculate a reference variable for a regulation unit from the first electric state variable and the second electric state variable, with the regulation unit regulating the first electric state variable in accordance with the reference variable.

8. The actuator regulation device according to claim 7, wherein at least one temperature sensor is provided to determine the temperature of the actuator, with a first characteristic curve member positioned between the control or regulation unit and the temperature sensor to determine a target value for the first electric state variable in accordance with the temperature of the actuator.

9. The actuator regulation device according to claim 8, wherein a number of temperature sensors are provided to determine the oil temperature, the cooling water temperature and/or the fuel temperature, with the temperature sensors being connected on the output side to an analysis unit, which determines the temperature of the actuator from the oil temperature, the cooling water temperature and/or the fuel temperature.

10. The actuator regulation device according to claim 8, wherein an electrical measuring device is provided to measure a second electric state variable of the actuator and the temperature sensor is connected to a second characteristic curve member, which determines a target value for the second electric state variable from the measured value of actuator temperature, with the second characteristic curve member and the electrical measuring device being connected to a comparison unit, which compares the target value of the second electric state variable with the measured value of the second electric state variable, in order to verify the correctness of the temperature measurement.

11. The actuator regulation device according to claim 8, wherein the first electric state variable is the electrical charge of the actuator.

12. The actuator regulation device according to claim 8, wherein the second electric state variable of the actuator is the electrical voltage of the actuator.

13. A method for setting a predetermined travel of an actuator comprising the steps of:
   setting a first electric state variable of the actuator, which determines the travel of the actuator, in accordance with the temperature of the actuator to avoid temperature-induced fluctuations of the actuator travel,
   measuring a second electric state variable of the actuator,
   calculating a reference variable from the first electric state variable and the second electric state variable, which corresponds to a predetermined travel of the actuator irrespective of the temperature of the actuator,
   regulating the first electric state variable in accordance with the reference variable, wherein the reference variable is calculated on the basis of a known temperature-dependent characteristic curve for the first electric state variable and a known temperature-dependent characteristic curve for the second electric state variable, so that both the first electric state variable and the second electric state variable behave according to the predetermined characteristic curves.

14. Method according to claim 13, wherein the first electric state variable is the electrical charge of the actuator.

15. Method according to claim 13, wherein the second electric state variable of the actuator is the electrical voltage of the actuator.

16. Method according to claim 13, wherein the actuator is a piezo-electric actuator for an injector of an injection system.

17. An actuator regulation device comprising:
   a drive circuit for setting a first electric state variable of the actuator, wherein the first electric state variable determines the travel of the actuator,
   a control or regulation unit for setting the first electric state variable in accordance with the temperature of the actuator,
   an electrical measuring device being provided to measure a second electric state variable of the actuator, and
   a computing unit connected to the electrical measuring device on the output side, which calculates a reference variable for a regulation unit from the first electric state variable and the second electric state variable, wherein the regulation unit regulates the first electric state variable in accordance with the reference variable, and wherein the computing unit calculates the reference variable on the basis of a known temperature-dependent characteristic curve for the first electric state variable and a known temperature-dependent characteristic curve for the second status variable, so that both the first electric state variable and the second electric state variable behave according to the predetermined characteristic curves.

18. The actuator regulation device according to claim 17, wherein the first electric state variable is the electrical charge of the actuator.

19. The actuator regulation device according to claim 17, wherein the second electric state variable of the actuator is the electrical voltage of the actuator.

20. The actuator regulation device according to claim 17, wherein the actuator is a piezo-electric actuator of an injection system for an internal combustion engine.

21. Method for setting a predetermined travel of an actuator, in particular a piezo-electric actuator for an injector of an injection system, in which a first electric state variable of the actuator is set which determines the travel of the actuator, wherein the first electric state variable is set in accordance with the temperature of the actuator to avoid temperature-induced fluctuations of the actuator travel and wherein a second electric state variable of the actuator is measured and a target value is determined from the measured value of the temperature of the actuator for the second electric state variable of the actuator, with the measured value of the second electric state variable being compared with the target value of the second electric state variable, to verify the correctness of the temperature measurement or the electric state variables.

22. An actuator regulation device, in particular for regulating a piezo-electric actuator of an injection system for an internal combustion engine, comprising:

a drive circuit for setting a first electric state variable of the actuator, with the first electric state variable determining the travel of the actuator;

a control or regulation unit for setting the first electric state variable in accordance with the temperature of the actuator; and an electrical measuring device operable to measure a second electric state variable of the actuator and the temperature sensor is connected to a second characteristic curve member operable to determine a target value for the second electric state variable from the measured value of actuator temperature, with the second characteristic curve member and the electrical measuring device being connected to a comparison unit operable to compare the target value of the second electric state variable with the measured value of the second electric state variable, in order to verify the correctness of the temperature measurement.

* * * * *

UNITED STATES PATENT AND TRADEMARK OFFICE
CERTIFICATE OF CORRECTION

PATENT NO. : 6,766,791 B2
DATED : July 27, 2004
INVENTOR(S) : Bock et al.

It is certified that error appears in the above-identified patent and that said Letters Patent is hereby corrected as shown below:

<u>Title page,</u>
Insert Item -- Foreign Application Priority Data:
      [30] December 18, 2000 (DE) ...........................100 63 080 --

Signed and Sealed this

Eleventh Day of January, 2005

JON W. DUDAS
*Director of the United States Patent and Trademark Office*